(12) United States Patent
Shitara et al.

(10) Patent No.: US 6,690,303 B1
(45) Date of Patent: Feb. 10, 2004

(54) CHARACTER INPUT METHOD

(75) Inventors: Sadanori Shitara, Tokyo (JP); Nobuaki Yokoyama, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 408 days.

(21) Appl. No.: 09/631,197

(22) Filed: Aug. 3, 2000

(51) Int. Cl.[7] .................. H03K 17/94; H03M 11/00
(52) U.S. Cl. ............... 341/23; 341/20; 341/22; 400/100; 345/168
(58) Field of Search .............. 341/20, 22; 400/100; 345/168; 379/93.18

(56) References Cited

U.S. PATENT DOCUMENTS

| | | | | |
|---|---|---|---|---|
| 3,675,513 A | * | 7/1972 | Flanagan | 379/93.18 |
| 4,012,599 A | * | 3/1977 | Meyer | 379/93.18 |
| 4,585,908 A | * | 4/1986 | Smith | 379/93.18 |
| 4,737,980 A | * | 4/1988 | Curtin et al. | 379/93.18 |
| 4,918,721 A | * | 4/1990 | Hashimoto | 379/93.18 |
| 5,924,803 A | * | 7/1999 | Curtin, IV et al. | 400/100 |
| 6,043,761 A | * | 3/2000 | Burrell, IV | 341/23 |

* cited by examiner

*Primary Examiner*—Timothy Edwards
(74) *Attorney, Agent, or Firm*—Flynn, Thiel, Boutell & Tanis, P.C.

(57) ABSTRACT

A character input method enables mistake of character input to be diminished, and it is unnecessary to use a rotary type switch in the character input method, therefore it is economical. In a frequency scanning type receiver, when it causes character input to be performed according to a key board section, respective numeric-keys 1 to 0 of 10-key correspond to a plurality of character groups consisting of capital letter, small letter of an alphabet, and numerals arranged in accordance with prescribed order to be determined. CPU/memory section selects the corresponding character group according to a numeric-key which is pressed firstly, next, the CPU/memory section selects corresponding alphabet character, numeral from among character group according to numeric-key which is pressed secondly.

11 Claims, 1 Drawing Sheet

CHARACTER INPUT METHOD

FIELD OF THE INVENTION

The present invention relates to a character input method of an electronic equipment whose operation is controlled by a microcomputer (CPU). More to particularly, this invention relates to a character input method of a frequency scanning type receiver.

DESCRIPTION OF THE PRIOR ART

There is an electronic equipment which employs a microcomputer (CPU) as an operation control means. For instance, a telephone in USA is such the electronic equipment. In a character input method of such the telephone, 10-key is mainly employed. Alphabet character is inputted in such a way of employing the 10-key with the following method.

---

It causes a key of "2" to correspond to "A", "B", and "C".
It causes a key of "3" to correspond to "D", "E", and "F".
:
:

---

For instance, in order to input the character of "C", after entering the character input mode, it causes the key of "2" corresponding to "C" to be maneuvered in 3 times. As a result, it is capable of being inputted the character "C" of the third character from among "A", "B", and "C" corresponding the key of "2".

However, according to such the character input method, when it causes the numeric-key to be maneuvered in 2 times or in 3 times with wrong timing, although prescribed number of operation of the numeric-key is executed, the CPU can not recognize the execution of operation of the numeric-key. As a result thereof, for instance, the character of "A", "B" or the character of "B", "A" is inputted by mistake. According to the above method, it is inconvenient.

For that reason, for instance, there is a character input method in which a rotary type switch is employed as a character input means. However, it is uneconomical to add the rotary type switch except for the 10-key. Further, it becomes complicated that it causes one character to be selected from among many characters by the rotary type switch.

SUMMARY OF THE INVENTION

In view of the foregoing, it is an object of the present invention, to provide a character input method in which it permits conventional character input method employing the 10-key to be improved, permitting character group corresponding to each 10-key to be determined, before it causes a numeral within respective character groups to be selected while maneuvering the 10-key in accordance with array sequence thereof. According to this method, it is intended to reduce operation of the same 10-key as much as possible. Thus, it is intended to resolve such the wrong input.

According to a first aspect of the present invention, in order to achieve the above-mentioned object, there is provided a character input method of an electronic equipment which includes a memory, a microcomputer, an electronic circuit whose operation is controlled by the microcomputer, a indicator section, and a character input means for inputting plural kinds of character information to the microcomputer, wherein the character input means has at least a plurality of numeric-keys of 1, 2, 3 . . . 0, and respective numeric-keys correspond to character group consisting of a plurality of alphabet characters which are arranged in accordance with prescribed order or numerals, in which it causes one character group to be selected according to operation of one numeric-key, subsequently, selecting to be inputted required alphabet character or numeral while maneuvering corresponding numeric-key to required alphabet character from among selected character group or numerals.

According to a second aspect of the present invention, in the first aspect, there is provided a character input method wherein respective numeric-keys of 2 to 9 from among the numeric-keys correspond to character group consisting of a plurality of capital letters and small letters of the alphabet arranged in accordance with prescribed order, an operator selects one character group according to operation of one numeric-key from among the numeric-keys of 2 to 9, thus the operator selects required capital letter of the alphabet while maneuvering a numeric-key corresponding to the order of required capital letter of the alphabet from among the selected character group, subsequently, the operator maneuvers prescribed function conversion key, before selecting to be inputted required small letter of the alphabet while maneuvering a numeric-key corresponding to order of small letter of the alphabet from among the selected character group.

According to a third aspect of the present invention, in the first or the second aspect, there is provided a character input method, wherein the electronic equipment is a frequency scanning type receiver.

According to a fourth aspect of the present invention, in the third aspect, there is provided a character input method, wherein it causes inputted character to be displayed on the indicator section.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DESCRIPTION OF THE PREFERRED EMBODIMENTS

Figure 1:
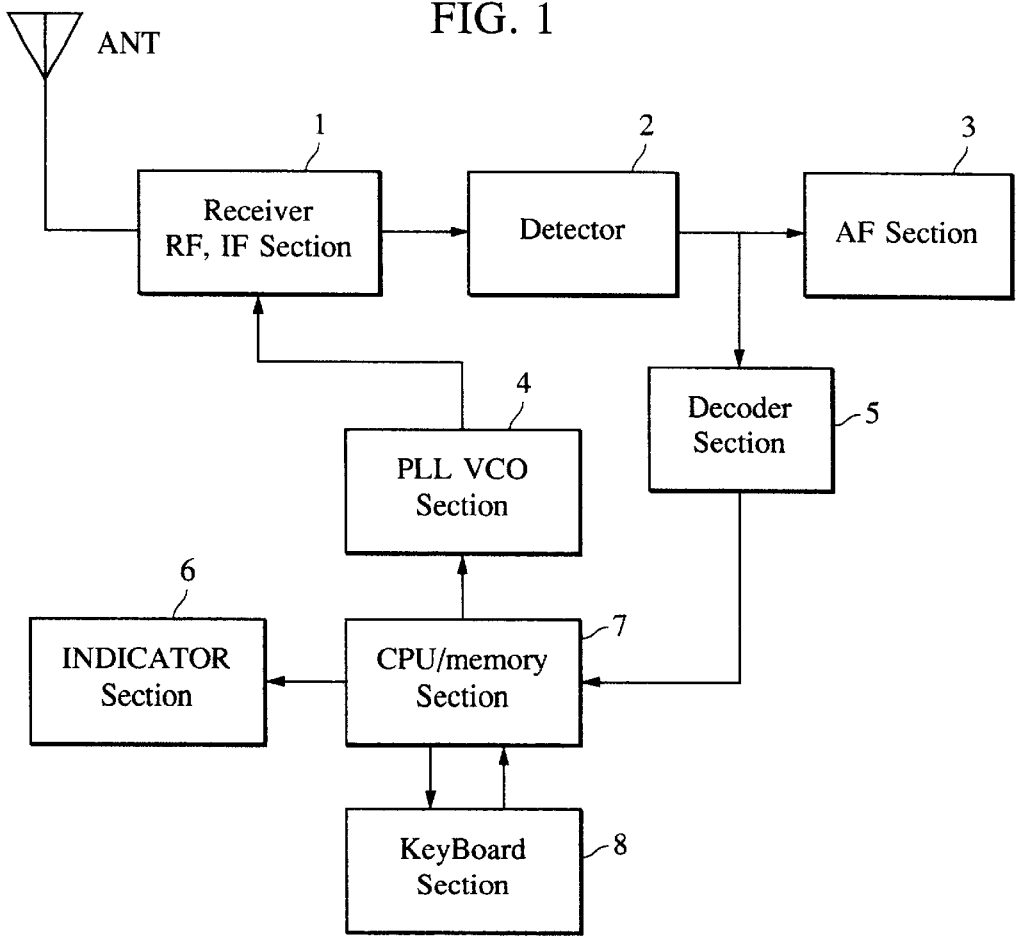
FIG. 1 is a block diagram showing a fundamental constitution of a frequency scanning type receiver to which a character input method of the present invention is applied.
Figure 2:
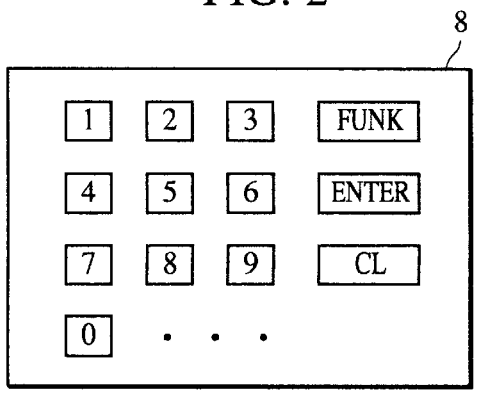
FIG. 2 is a schematic view showing a constitution of a key board section of the above receiver.

A preferred embodiment of the present invention will now be described in detail in accordance with the accompanying drawings. FIG. 1 shows a fundamental constitution of a frequency scanning type receiver for receiving radio signal of VHF-band, UHF-band to which the character input method of the present invention is applied. In FIG. 1, reference numeral 1 is a receiver consisting of an RF amplifier, an IF amplifier, and so forth, 2 is a detector, 3 is an AF (audio frequency) section, 4 is a PLL (phase-locked loop) section including a voltage-controlled oscillator (VCO) and so forth, 5 is a decoder section, 6 is a indicator section, 7 is a CPU/memory section including memories, and 8 is a key board section constituting information input part for the sake of the character input, the data input and so forth, and which key board section has 10-key 1 to 0, function conversion key of "FUNK", input key of "ENTER", and so forth as shown in FIG. 2.

In the receiver of FIG. 1, the input data from the key board section 8 is read by the CPU/memory section 7 due to a program stored in the memory of the CPU/memory section 7. Thus, the CPU/memory section 7 sends the necessary data to the PLL section 4 according to the instruction given by the input data from the key board section 8. Subsequently, the CPU/memory section 7 causes the signal of local frequency for executing necessary heterodyne operation to be outputted from the VCO within the PLL section 4 to the receiver 1.

On the other hand, the CPU/memory section 7 displays information of the reception frequency and so forth adjusted to the data sent to the PLL section 4 in detail on the indicator section 6. The reception signal from an antenna ANT is mixed with the signal of the local frequency of the VCO of the PLL section 4 at the receiver 1, before the IF signal obtained from the mixed signal is detected by the detector 2, subsequently, the audio signal after detection is sent to the AF section 3.

Here, when ID code (identification code) is included in the reception signal, the decoder section 5 reads the ID code, before the CPU/memory section 7 processes it, thus causing the ID code to be displayed on the indicator section 6 using the decimal numeration system and so forth.

After determination of the reception frequency or the ID code, it causes necessary display data to be inputted to the CPU/memory section 7 from the key board section 8 in order to display a radio station name and so forth together with them simultaneously.

The CPU/memory section 7 sends the display signal on the basis of the above-described display data for displaying the radio station name and so forth. On the other hand, it causes the name of the radio station and so forth corresponding to the reception frequency to be registered into the memory within the CPU/memory section. Thus, the indicator section 6 displays the registered name of the radio station and so forth in every reception of the signal of the radio frequency.

As described-above, in the receiver of FIG. 1, it enables the frequency or the ID display to be performed on the occasion of reception of the signal. Further, it enables the name of the radio station corresponding thereto and the character representing ID and so forth to be registered. The method for implementing the character input is the following method.

According to the above description, in order to resolve the fault of the conventional character input method, in the character input method of the present invention, it causes respective numeric input keys 1 to 0 of the 10-key to correspond to a plurality of numerals in accordance with prescribed order, and the character groups consisting of the capital letters and the small letters of the alphabet to be determined. The 10-key in the key board section 8 according to the present invention is shown in the following table as one example. Concretely, the CPU/memory section 7 selects corresponding character group according to the numeric-key which is pressed firstly. Subsequently, the CPU/memory section 7 selects the corresponding alphabet character, or the numeral from among character group according to the numeric-key pressed secondly. Namely, in order to input the alphabet, it causes one character group to be selected while pressing one numeric-key from among the numeric-keys of 2 to 9. Next, it causes the capital letter of the alphabet required to be selected while pressing the corresponding numeric-key (the numeric-key of "2" if it is second order as "B") to the order of the required capital letter of the alphabet from among the selected character group.

Next, in order to select the small letter of the alphabet, the operator presses prescribed the function conversion key "FUNK", to select small letter of the alphabet. Next, it causes the small letter of the alphabet required to be selected while pressing the corresponding numeric-key (the numeric-key of "2" if it is second order of the small letter as "b") to the order of the required small letter of the alphabet from among the selected character group.

Furthermore, in order to select required numeral, the operator presses the numeric-key of "1" to select numeric group (1 to 0), so that the operator selects required numeral while pressing the numeric-key (the numeric-key of "2" if required numeral is second order of the numeric group as "2").

There will be described following procedure for inputting "HAM6m" as example:

(1) pressing the numeric-key "4" to select the alphabet character group (G to I), subsequently, pressing the numeric-key "2" to select the capital letter "H" which is the second order of the alphabet character group (G to I);

(2) pressing the numeric-key "2" to select the alphabet character group (A to C), subsequently, pressing the numeric-key "1" to select the capital letter "A" which is the first order of the alphabet character group (A to C);

(3) pressing the numeric-key "6" to select the alphabet character group (M to O), subsequently, pressing the numeric-key "1" to select the capital letter "M" which is the first order of the alphabet character group (M to O);

(4) pressing the numeric-key "1" to select the numeric group of (1 to 0), subsequently, pressing the numeric-key "6" to select the numeral "6" of the sixth order;

(5) pressing the numeric-key "6" to select the alphabet character group (M to o), subsequently, pressing the "FUNK" key for selecting the small letter, then pressing the numeric-key "1" to select the small letter "m" which is the first order of the alphabet character group of the small letters (m to o);

(6) "HAM6m" is selected according to the above-described key operation. When the operator completes the character input while pressing the "ENTER" key, "HAM6m" is registered into memory within the CPU/MEMORY SECTION 7. "HAM6m" is displayed on the indicator section 6.

As described above, according to the character input method of the present invention, it is capable of diminishing input error of the character. Further, since it is unnecessary to use the rotary type switch, it is economical.

Furthermore, the character input method of the present invention is applicable to the personal computer and so forth except for the device shown in FIG. 1.

While preferred embodiments of the invention have been described using specific terms, the description has been for illustrative purpose only, and it is to be understood that changes and variations may be made without departing from the spirit or scope of the following claims.

TABLE

| INPUT KEY | CHARACTER, MARK GROUP CORRESPONDING KEY |
| --- | --- |
| 1 | 1, 2, 3, 4, 5, 6, 7, 8, 9, 0 |
| 2 | A, B, C, a, b, c |
| 3 | D, E, F, d, e, f |
| 4 | G, H, I, g, h, I |
| 5 | J, K, L, j, k, l |
| 6 | M, N, O, m, n, o |
| 7 | P, Q, R, S, p, q, r, s |
| 8 | T, U, V, t, u, v |
| 9 | W, X, Y, Z, w, x, y, z |
| 0 | ., -, #, _, @, +, *, &, /, $, %, !, ), (, ?, —, >, ', " |
| . | |
| CL | SPACE |

What is claimed is:

1. A character and numeral input method of an electronic equipment which includes a memory, a microcomputer, an electronic circuit whose operation is controlled by said microcomputer, an indicator section, a numeral input device for inputting a plurality of numerals to said microcomputer, a character input device for inputting plural kinds of character information to said microcomputer, and at least a predetermined function conversion key, said character input device having a plurality of individual numeric-keys numbered 2 to 9, said numeral input device having a numeric-key 1 as a numerical group selection key;

each of said numeric-keys 2 to 9 corresponding to a separate character group, comprising a plurality of capital letters and small letters of the alphabet arranged in accordance with a prescribed order;

said numeric-key 1 corresponding to a numerical group 0 to 9;

said input method comprising the steps of:

selecting one character group by operating one numeric-key from among said numeric-keys of 2 to 9;

subsequently operating a numeric-key corresponding to a desired capital letter of the alphabet provided in the selected character group to select the desired capital letter;

operating the predetermined function conversion key;

operating a numeric-key corresponding to a desired small letter of the alphabet to select the desired small letter;

operating the numeric-key 1 to select the numerical group of 0 to 9; and operating a numeric-key corresponding to a desired numeral in the numerical group to obtain the desired numeral.

2. A character and numeral input method according to claim 1 wherein said electronic equipment is a frequency scanning type receiver.

3. A character and numeral input method according to claim 1 wherein said electronic equipment i s arranged so that inputted characters and numerals are displayed on said indicator section.

4. A character and numeral input method for an electronic equipment having a memory, a microcomputer, an indicator section and a character and numeral input device, the input device including at least a set of numeric keys 0–9, a function key and an enter key, the input device selectively inputting numerals according to the steps of:

(a) engaging and releasing the numeric key 1;

(b) subsequently engaging and releasing one of the numeric keys corresponding to the numeral to be entered;

(c) selectively repeating steps (a) and (b) above to input multiple numerals if so desired; and the input device seletively inputting letter characters according to the steps of:

(d) engaging and releasing one of the numeric keys corresponding to a letter character group;

(e) subsequently engaging and releasing one of the numeric keys corresponding to a desired letter character in the selected character group; and (f) selectively repeating steps (d) and (e) above to input multiple letter characters if so desired; and the input device completing entry of at least one of the characters and numerals by the step of engaging the enter key.

5. The character and numeral input method according to claim 4, wherein the sequence of step (d) and step (e) results in the selected letter character being in upper case format and the method includes the step of:

engaging the function key after step (d) and before step (e) to provide the selected letter character in lower case format.

6. The character and numeral input method according to claim 4, the input device including a clear key, the input method including the step of:

engaging and releasing the clear key for providing a blank space between characters.

7. The character and numeral input method according to claim 4, including the step of:

engaging and releasing the numeric key 0 to select a punctuation character group.

8. The character and numeral input method according to claim 4, wherein the indicator section displays the selected characters and numerals.

9. The character and numeral input method according to claim 4, wherein the numeric keys that each correspond to a different letter character group comprise the numeric keys 2 to 9.

10. The character and numeral input method according to claim 9, wherein the numeric keys that correspond to a desired letter character within the selected character group comprise the numeric keys 1 to 3.

11. The character and numeral input method according to claim 4, wherein the numeric keys that correspond to a desired letter character within the selected character group comprise the numeric keys 1 to 3.

* * * * *